US005801387A

United States Patent [19]

[11] Patent Number: 5,801,387

[45] Date of Patent: Sep. 1, 1998

Nablo et al.

[54] METHOD OF AND APPARATUS FOR THE ELECTRON BEAM TREATMENT OF POWDERS AND AGGREGATES IN PNEUMATIC TRANSFER

[75] Inventors: Samuel V. Nablo; James C. Wood, Jr., both of Lexington, Mass.

[73] Assignee: Electron Processing Systems, Inc., N. Billerica, Mass.

[21] Appl. No.: 824,529

[22] Filed: Mar. 26, 1997

Related U.S. Application Data

[60] Provisional application No. 60/014,313 Mar. 28, 1996.

[51] Int. Cl.$^6$ ........ H01J 37/30

[52] U.S. Cl. ........ 250/492.3; 250/435; 250/398; 250/400

[58] Field of Search ........ 250/492.3, 492.1, 250/428, 430, 432 R, 435, 398, 400

[56] References Cited

U.S. PATENT DOCUMENTS

| | | | |
|---|---|---|---|
| 2,429,217 | 10/1947 | Brasch | 250/42 |
| 3,780,305 | 12/1973 | Free | 250/492.3 |
| 3,863,163 | 1/1975 | Farrell et al. | 328/233 |
| 4,333,036 | 6/1982 | Farrell | 313/420 |
| 4,591,756 | 5/1986 | Avnery | 313/420 |
| 4,786,844 | 11/1988 | Farrell | 315/111.21 |
| 5,434,421 | 7/1995 | Burth et al. | 250/434 |
| 5,489,783 | 2/1996 | Kristiansson | 250/442.3 |

FOREIGN PATENT DOCUMENTS

| | | |
|---|---|---|
| 0 197 217 | 2/1992 | European Pat. Off. . |

OTHER PUBLICATIONS

International Atomic Engery Agency Vienna, 1966 "Food Irradiation"; P.B. Cornwell; pp. 455, 464–465 & 470–471. Presented at the 10th Int. Meeting on Radiation Processing; Anaheim, CA 14 May , 1997; "Sterlization of Foods with low–energy electrons (Soft–Electrons)".

*Primary Examiner*—Kiet T. Nguyen
*Attorney, Agent, or Firm*—Nields, Lemack & Dingman

[57] ABSTRACT

Powders and aggregates are treated in pneumatic transfer as a thin layer moving at high velocity which electrons from a selfshielded electron beam processor of voltage less than or equal to 500 kilovolts.

5 Claims, 9 Drawing Sheets

METHOD OF AND APPARATUS FOR THE ELECTRON BEAM TREATMENT OF POWDERS AND AGGREGATES IN PNEUMATIC TRANSFER

BACKGROUND OF THE INVENTION

This application claim the benefit of USC §119(c) of any US Provisional application no. 60/014,313, filed Mar. 28, 1996.

1. Field of the Invention

The invention relates to electron processing.

The industrial application of electron beam energy sources has been given great impetus in the last two decades by the advent of unscanned, compact, selfshielded sources in the accelerator voltage range of 50–500 kV. Such energy sources possess modest penetration capability in typical hydrocarbons or modified like materials of interest in industry for use in adhesives, coatings and inks curing or for film modification (i.e. crosslinking and/or grafting). Some typical penetration depths for uniform electron processing are shown in FIG. 1.

2. Description of the Related Art

Electron penetration in matter is determined exactly by electron-electron scattering cross-sections, so that it is possible to model a given electron beam product handling geometry quite precisely using Monte Carlo codes. Clearly, one of the problems associated with the presentation of aggregates or powders to the electron beam, lies in the control of the fluidized bed thickness so that the effective range of penetration is not exceeded and good quality control of the process is possible.

A typical selfshielded processor working at 200 kV for example, has an effective depth of penetration of 250 gsm or 250 micrometers of unit density material. If one desires to treat fine powders continuously, for example powders of 100 mesh or 149 μm maximum diameter, it becomes impracticable to distribute such powders in a "monolayer" for passage underneath the electron beam (FIG. 2 (a)) or to move them along the gravitational field in free fall (FIG. 2(b)).

Because of their very large surface areas ($4\pi r^2$) for such particles/powders, they tend to stick to each other and to the carrier surfaces and to agglomerate, while the free-fall technique leads to velocities totally impractical for high volume processing. As a consequence, there appears to be no prior art for the use of low energy i.e. E≦500 keV, selfshielded electron processors for the treatment of powders and aggregates.

SUMMARY OF THE INVENTION

This disclosure teaches techniques and apparatus for the application of selfshielded electron beam processors of voltages≦500 kilovolts for the treatment of powders and aggregates in pneumatic transfer. That is, while the materials to be processed are supported in an air or gas fluidized bed or column, wherein the total thickness of the stream does not exceed the effective penetration depth of the electrons provided by the electron beam processor.

The processes disclosed here are for the following uses: sterilization of fine powders, surface sterilization of coarse powders and aggregates, surface modification of raw materials and of industrial polymeric materials and pigments, disinfestation of agroproducts such as grains, feeds, feed additives such as fish meal, etc., disinfestation of food products and additives for human consumption, and radiation pasteurization of stored food products for shelf-life extension under aseptic packaging conditions.

BRIEF DESCRIPTION OF THE DRAWINGS

The invention may best be understood from the following detailed description thereof, having reference to the accompanying drawings, in which.

DESCRIPTION OF THE PREFERRED EMBODIMENTS

The Physical Principles Of The Technique

Figure 3:
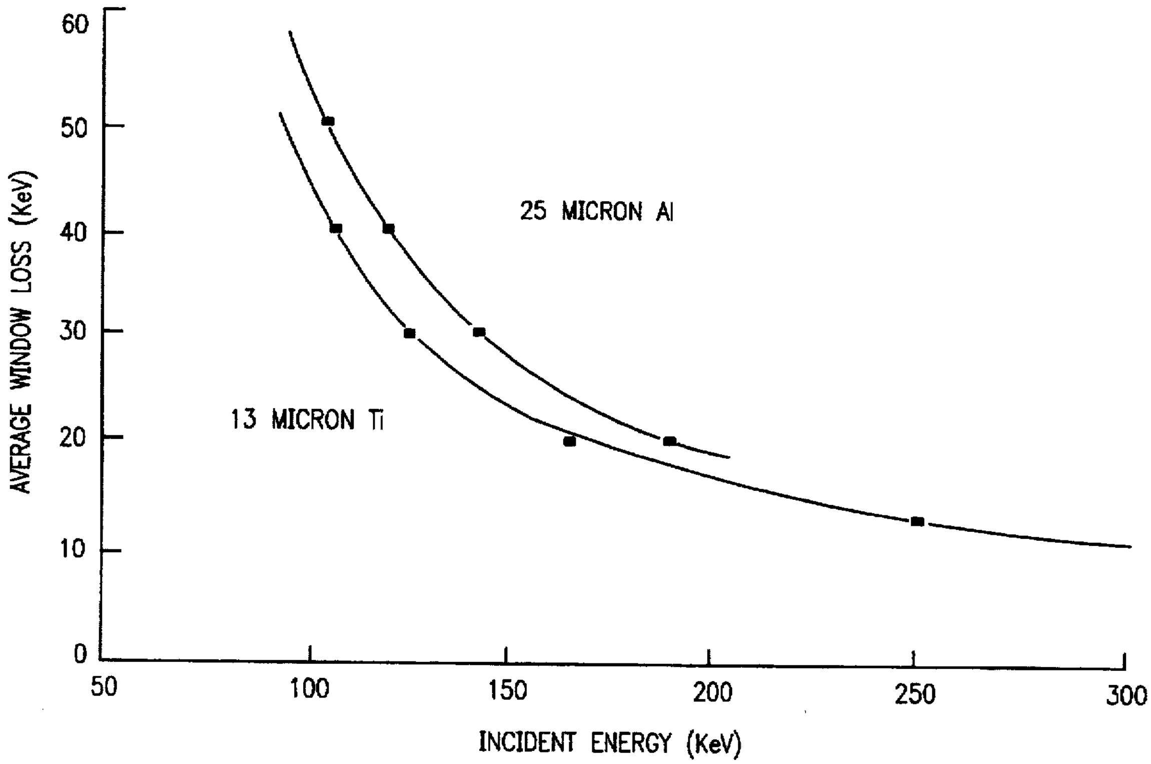
FIG. 3 is a graph showing typical energy loss figures for foils frequently used with electron processors.
Figure 4:
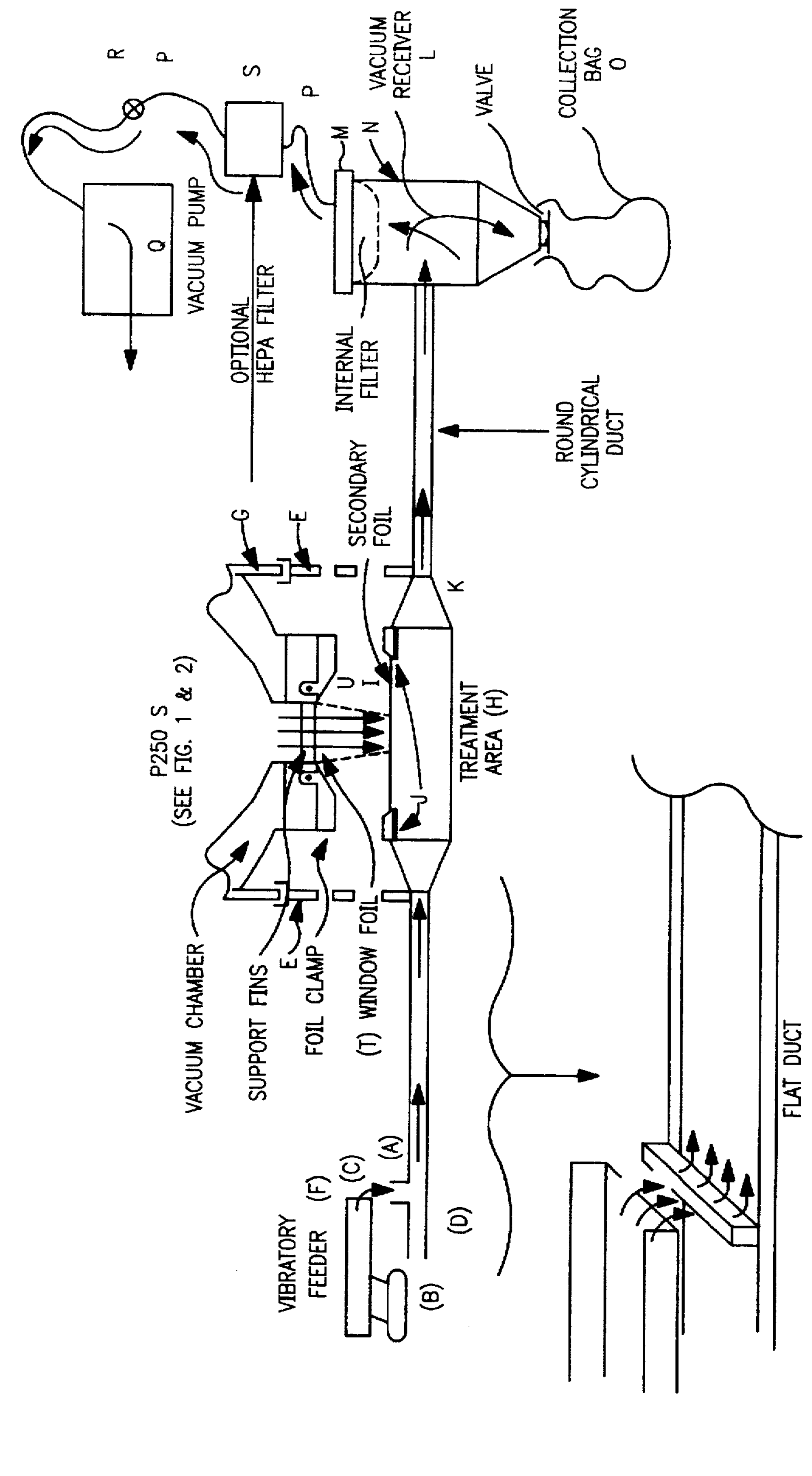
FIG. 4 is a somewhat diagrammatic view of apparatus embodying our invention.

When energetic (accelerated) electrons pass from the vacuum tube in which they are generated to the 1 bar environment in which the product is passing through the energy stream (electron beam), energy is lost in the foil or window which constitutes the "transmission" area of the vacuum tube envelope. Typical energy loss figures for the 12.5 μm Titanium or 25 μm Aluminum foils frequently used with these processors are shown in FIG. 3, while the configuration used in the studies supporting this disclosure is shown in FIG. 4, in which case two 12.5 μm Titanium foils are separated by an air gap of 17 mm between the window foils. Now from FIG. 3, we see that at 200 kV, the beam energy loss in the first window is 17 keV at 200 kV, resulting in a beam energy of 183 keV; the loss in the second window is about the same so that the mean beam energy is reduced to 164 keV. Losses in the 17 mm (or 20 gsm) air column are~5 keV, so that the mean energy of the emergent beam into the treatment area of FIG. 4 is ~160 keV. Such beam energy will provide relatively uniform dose distribution in a product of 160 gsm thickness (see FIG. 1).

Figure 1:
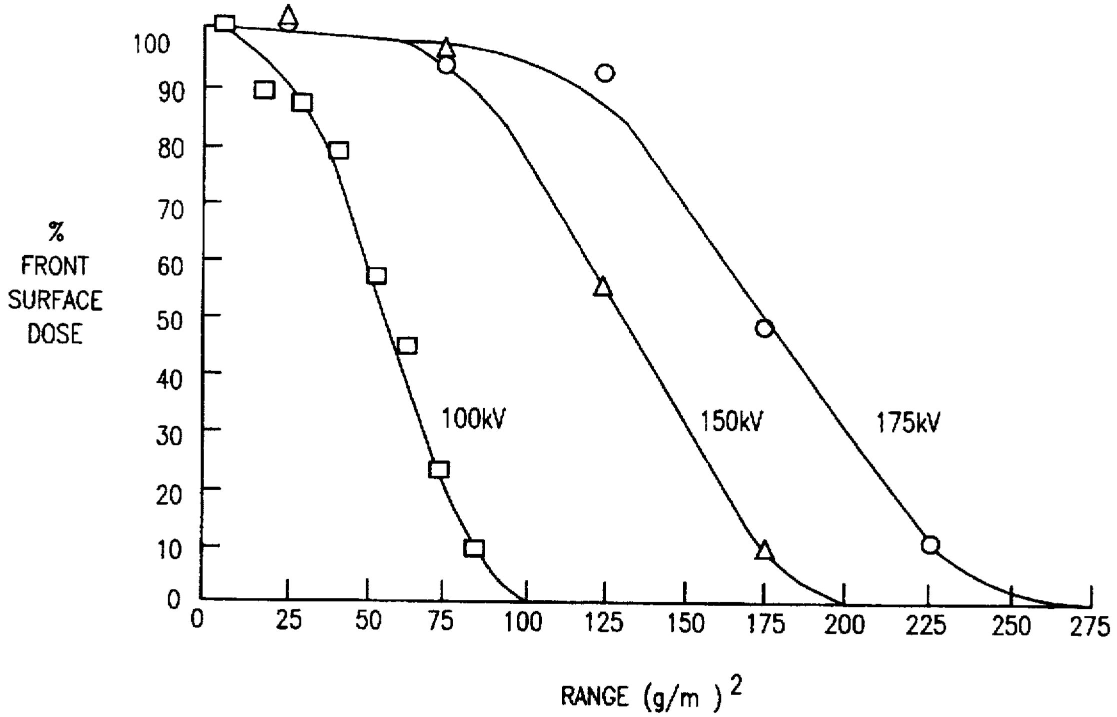
FIG. 1 is a graph showing some typical penetration depths for uniform electron processing.

The method taught here utilizes low energy electron beams to treat a fluidized bed of powder in air or in an inert gas in order to accomplish high rates of mass transport/processing utilizing high air stream velocities with low bed thicknesses. A distinct advantage of the use of electrons at reduced energy is the high scattering cross-sections for these particles and the large r.m.s. scattering angles which result as they penetrate into the fluidized bed. As a consequence, uniform treatment of fluidized beds of powder whose total thickness approaches that at which the treatment level has fallen to 80% of that of the "front" surface; i.e. the incident surface. As shown in the curves of FIG. 1, this would be 100 gsm for a single window 150 kV processor.

Figure 5:
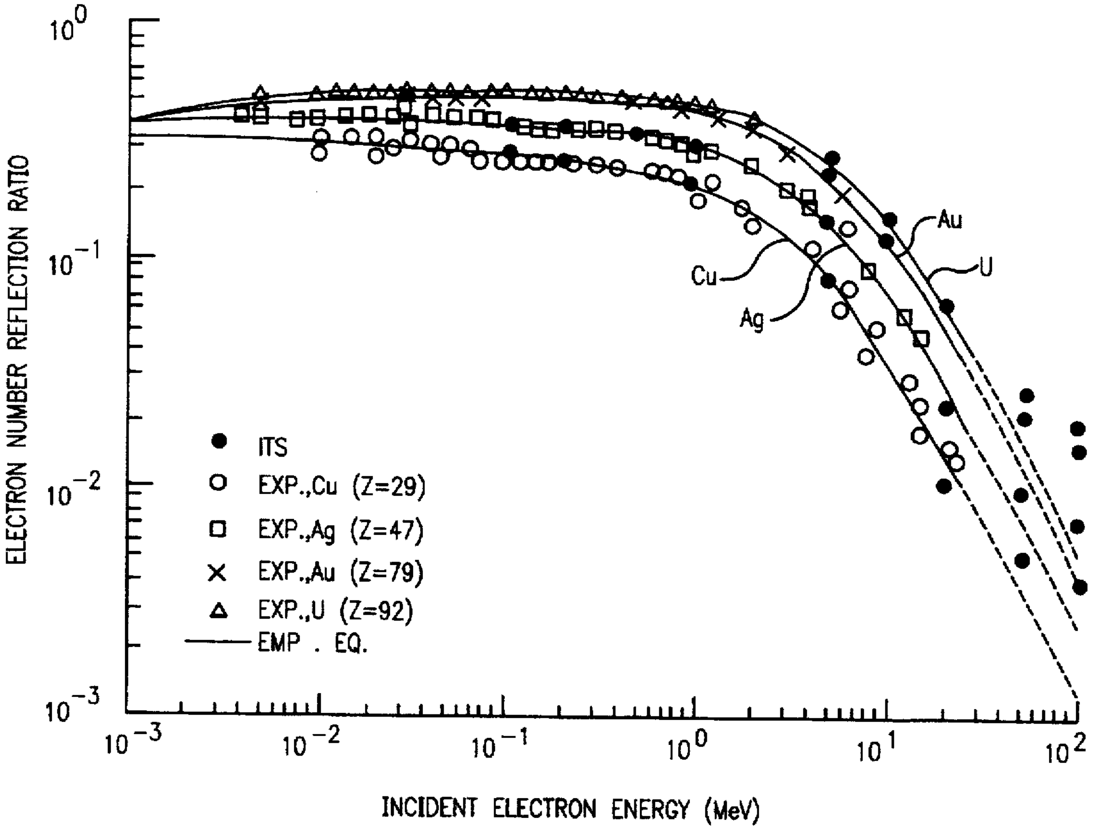
FIG. 5 is a graph showing efficiency of reflection.

Furthermore, electrons in the energy range of 10–500 keV have a very high probability of backscatter from a cavity wall (such as the treatment area of FIG. 4) if they are not totally absorbed in the fluidized bed. These reflection coefficients depend strongly on the atomic number; i.e. electron density, of the material they strike, but high Z liners of such irradiation zones are quite practicable. As shown in FIG. 5, efficient reflection occurs in this energy range with values from 30% for Copper to over 50% for Gold, Tantalum, etc.

A good understanding of the irradiation conditions in an arrangement similar to FIG. 4 can be obtained from a computer simulation of the experiment using a semi-empirical code such as "EDMULT" available as EDMULT 3.11 (ccc-430), "Evaluation of Electron Depth-Dose Distribution in Multilayer Slab Absorbers", Radiation Information Shielding Center, ORNL, Oak Ridge, Tenn. For more complex geometries, the TIGER series of Monte Carlo codes is more appropriate, available also from ORNL. Here the irradiation conditions are: Accelerator Voltage: 225 kV; drift air gap to secondary window: 3.0 cm; primary and secondary windows: 12.5 μm Titanium; primary window width: 5.0 cm, secondary window width: 7.5 cm; treatment duct thickness: 3.0 cm. Preferably, the treatment duct thickness is of the order of 5.0 cm.

Figure 6:
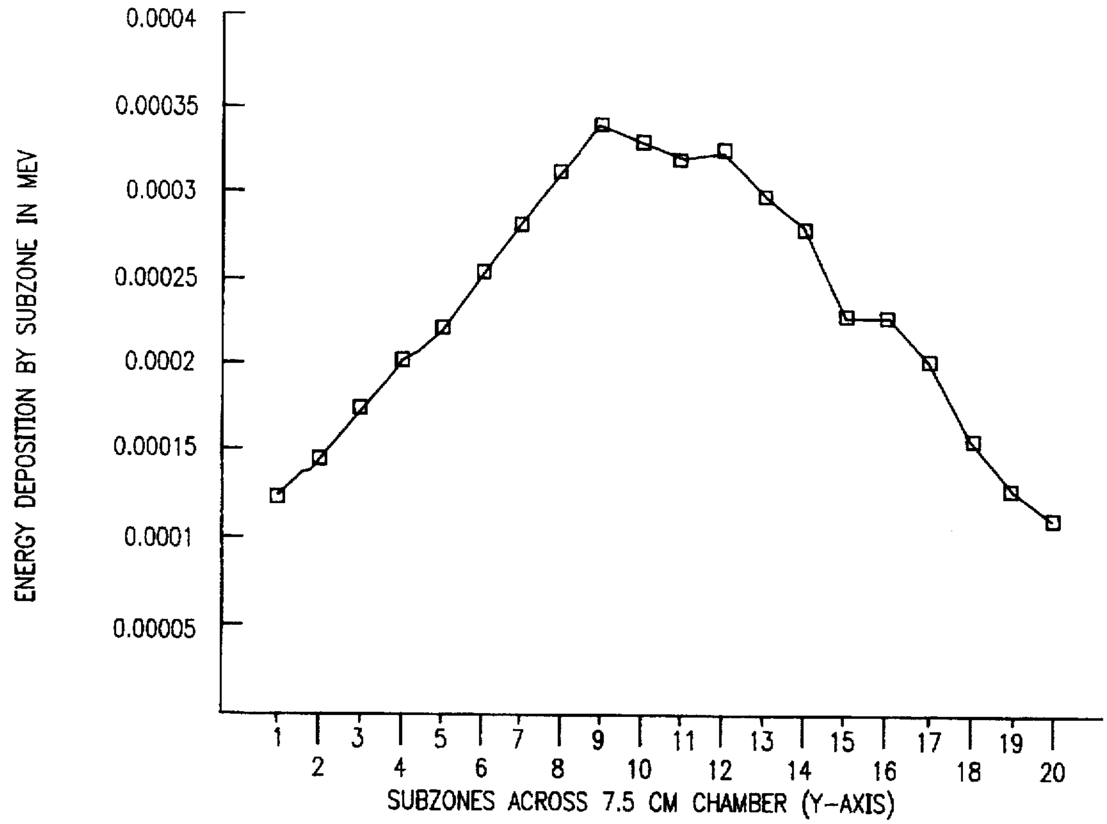
FIG. 6 shows the electron current density distribution in the treatment duct of FIG. 4.
Figure 7:
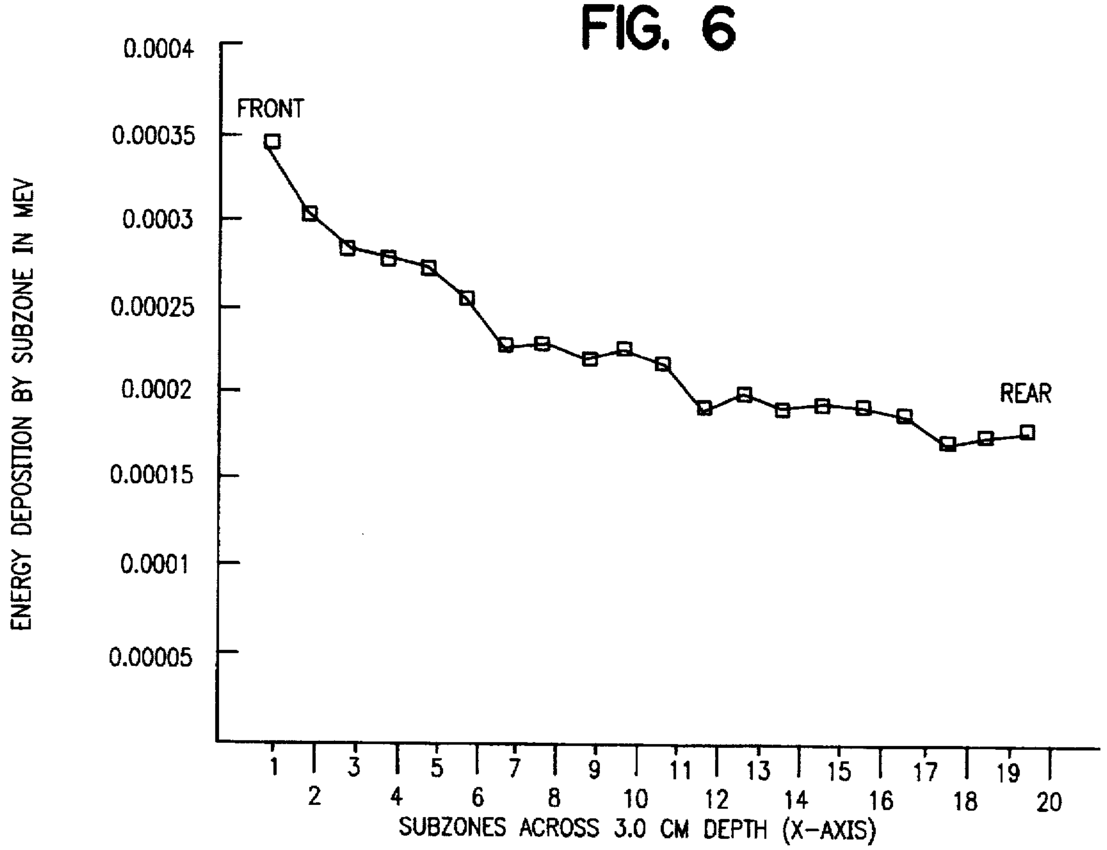
FIG. 7 shows the dose distribution down through the treatment duct of FIG. 4.

The electron current density distribution in the treatment duct is shown in FIG. 6 and is the dose rate distribution through which the product moves to receive its total integrated treatment. For the rather "severe conditions" used in these calculations ( a 3 cm deep irradiation chamber, carrying a 36 gsm fluidized bed), the dose distribution down through the treatment duct is shown in FIG. 7. For these conditions it shows a top surface:bottom surface dose ration of 1.7:1.0, ignoring backscattering effects which considerably improve (reduce) this ratio.

Description Of The Apparatus

The arrangement of apparatus used to demonstrate this process is shown in FIG. 4. Powder feeding was accomplished with an Syntron™ feeder F manufactured by FMC Corporation. The oscillation of the feeder chute C can be controlled in amplitude so that its 60 HZ oscillations will distribute the powder over the chute surface and deliver it at a uniform, measurable rate to the air stream flowing in duct D. The duct is fitted with a rectangular feed funnel A mounted on the infeed side of the duct. End B of the duct is open but may be throttled with a damper to control air flow in D. Shielded adapting collar E provides radiation shield mating with the processor shroud G, so that no radiation leakage can occur, and provides a rigid mount for the section of duct D containing the treatment zone H in which the secondary window I for electron entrance is mounted. This window is sealed with gasket J so as to prevent leakage of the product from the duct, or leakage of ambient air into the duct during operation. A transition section K tapers the rectangular treatment duct, where such a geometry is necessary for efficient electron utilization, to a cylindrical duct for ease of adaptation to the collector. This geometry and its radiation shielding is important for this compact, self-shielded design.

The collector assembly L, manufactured by Vac-U-Max Inc. of Belleville, N.J., consists of a removable sealed top M, which can be readily clamped against the collector body N and covers the supported Goretex™ filter for separation of particulate matter in the fluidized bed from the air stream. Top M is fitted with a manual toggle switch for providing an air "bump" or pulse to the filter to separate the powder from its outer surface so that it drops into the lower part of L for collection in bags O if desired. Flexible vacuum tube P connects the lid M of the collector to Rotron™ regenerative blower Q (manufactured by EG & G Inc.) so that it can provide suction for the required air flow used to establish the fluidized bed. Flow can be throttled by Globe valve R installed in tube P if reduced flow rates and hence lower bed velocities are desired. High capacity HEPA filter S is mounted on the blower Q exhaust to prevent any particulate matter still in the air stream after passing through the receiver filter in N from reaching the ambient environment. For the tests conducted here where ozone generation was of concern in the working environment, the HEPA filter was enclosed in a large, foil lined sealed box, which could be vented by means of a 6" diameter duct and 500 scfm blower, to the outside of the building where suitable $0_3$ disposal could be accomplished.

The blower was fitted with a manual switch so that the required air stream flow in D could be established before feeder F introduced powder to establish the desired fluidized bed. Electron processor S with its primary window T was set at the desired dose rate (current and voltage) before feeder F was activated. A nitrogen stream was used to flush the otherwise stagnant air in drift region U between window T and secondary window I. Mechanical clamps and rubber gaskets were used to seal the interconnect surfaces of the demountable and cleanable transport assembly.

Fluidized Bed Loading Considerations

Figure 2A:
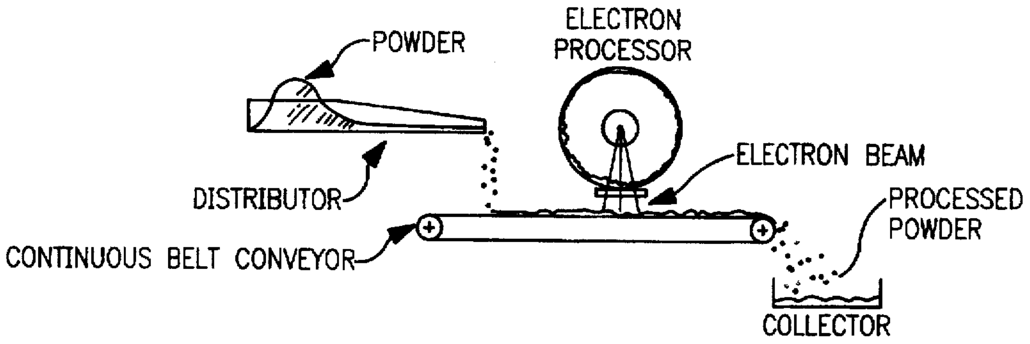
FIG. 2A shows one approach to the handling of fine powders for electron treatment: namely, distribution and transport on a continuous conveyor.
Figure 2B:
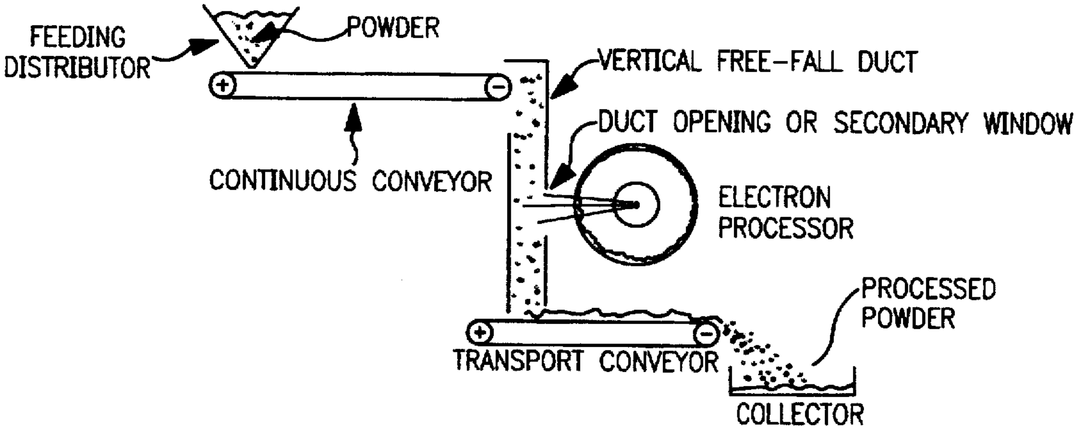
FIG. 2B shows another approach to the handling of fine powders for electron treatment: namely, continuous treatment of product in gravitational fall.

The efficacy of the process taught here stems from the ability of low energy electrons to couple their energy into thin product (in this case, streams or fluidized beds) moving at high velocities. As a result, even though the stream is thin, the high transport velocities can result in the large processed mass flow rates required for meaningful industrial application. Such transport velocities are obviously not achievable with the product handling techniques illustrated in FIG. 2.

For the "proof of principle" studies conducted in support of this application, a modest duct cross sectional area of 3 square inches was selected, utilizing a rectangular duct some 6" wide×½" deep for feed distribution and treatment, then transitioning into a 2" diameter duct for transport to the collector. A schematic representation of this apparatus coupled to a 250 kV electron processor is shown in FIG. 4.

Figure 8:
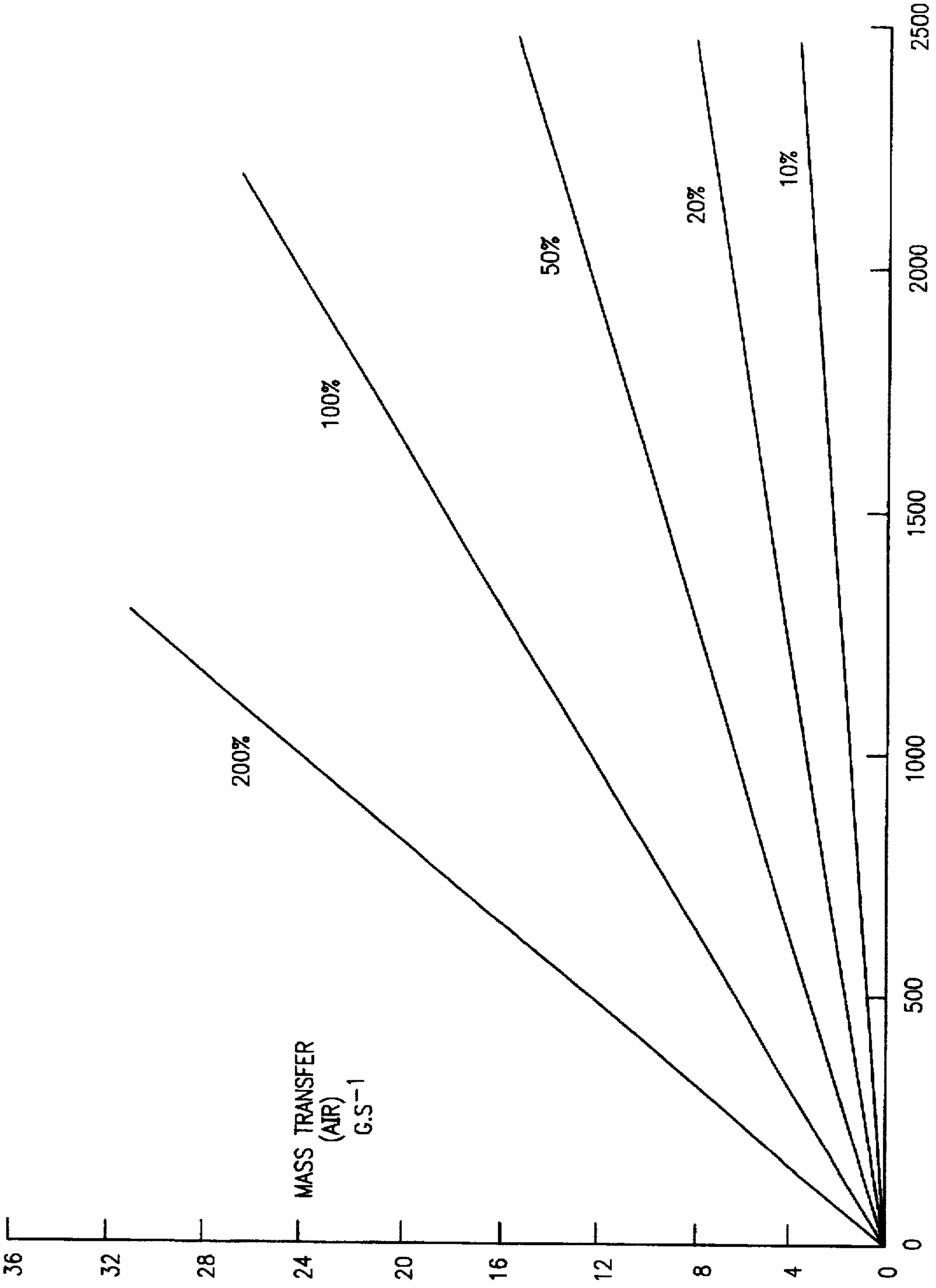
FIG. 8 shows some estimates of material transport rates.

Some estimates of material transport rates are shown in FIG. 8 over the velocity range of 0–2500 fpm (0–762 mpm). These calculations are based upon the assumption of atmospheric pressure of air in the duct with a density of $1.2\times10^{-3}$ g/cc. For the ½" deep duct selected, the 1.27 cm thickness presents only $1.5\times10^{-3}$ g/cm$^2$ or 15 g/m$^2$ of air to the beam (see FIG. 1). Even at a loading of 100%, the stream thickness is a modest 30 g/m$^2$ and is easily penetrated by a low energy electron beam if no significant "clumping" of fine powders occurs. As shown in FIG. 8, at this modest stream loading figure (100%), feed rates of 24 g. sec$^{-1}$ are practicable at stream velocities of 2000 fpm (610 mpm), resulting in very realistic feed rates for industrial application; e.g. 86.4 kg or 190 pounds per hour. If we were to raise the duct thickness to 6.5 cm so that we now used a product thickness of 90 g/m$^2$ (i.e. ×6), these flow rates are over 500 kg/h. Preferably, the thin layer has a stream thickness which is less that 500 g/m$^3$.

Now one can estimate the processing capability of such a coupled system based upon the yield values for the electron beam machine. The yield value for an EB processor is taken from the relationship D=kI/v where D is the dose, usually in kiloGrays, the International Unit of dose which is defined as 1 kjoule of absorbed energy/kg of product. Ten kiloGrays is now the equivalent of 1 Megarad, or the absorption of 10 joules of energy per gram of product. In this relationship, I is the machine current in ma and v is the product speed. If v is measured in mpm, k will have the units of Mrad mpm per ma, or kGy mpm per ma if International Units are employed.

Figure 9:
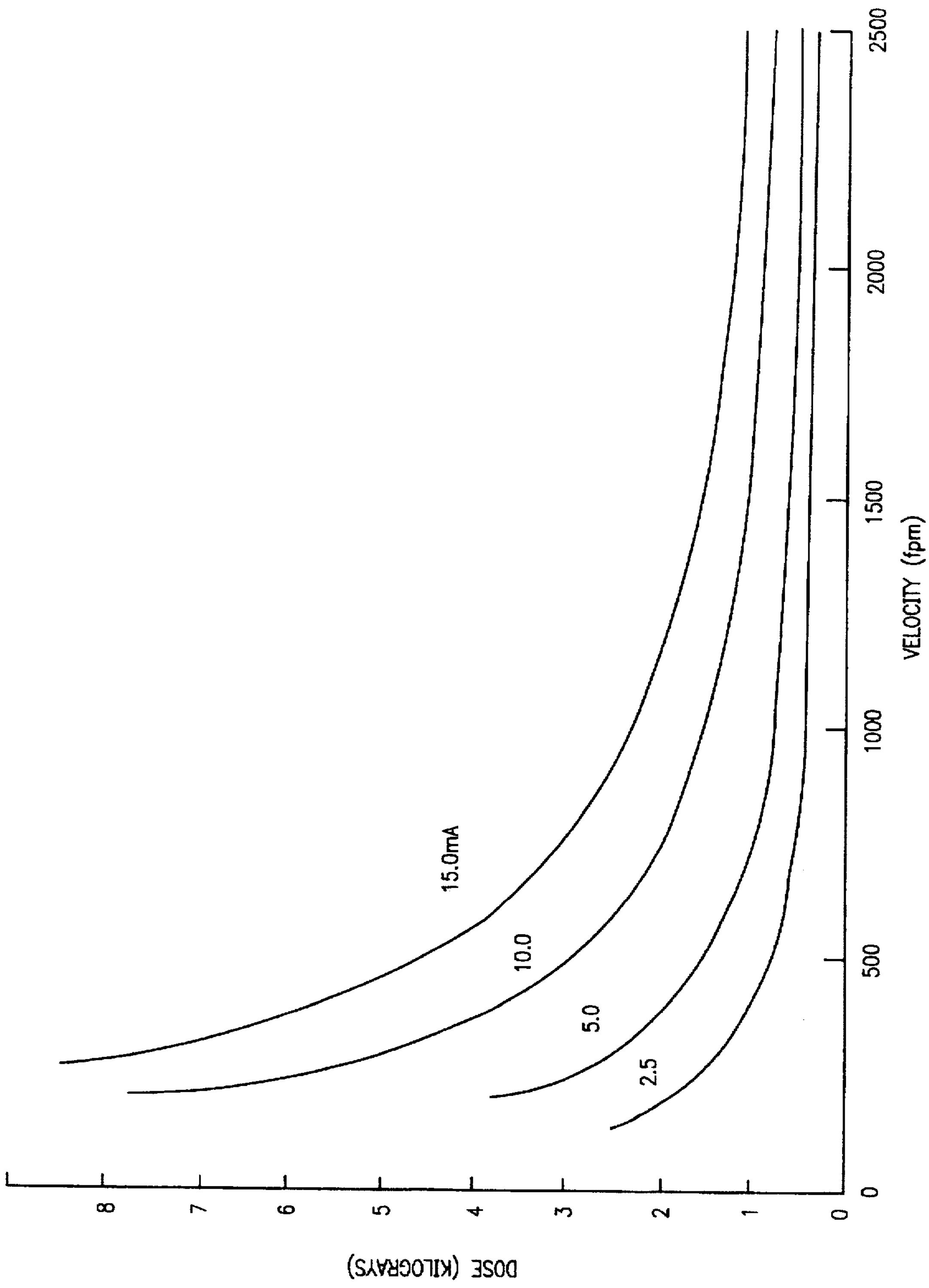
FIG. 9 shows calculations for dose delivery capability.

For the configuration shown in FIG. 4 as employed in these studies, the measured reduction of the machine yield value by the secondary Titanium window was 0.72. For the calculations shown in FIG. 9 for Dose Delivery capability, a more conservative figure of 0.58 was used. Here we had assumed a reduction in the yield value of the processor used from 26 Mrad fpm/ma to 15 Mrad fpm/ma. The measured value was actually 18.8 Mrad fpm/ma for this 250 kV×20 ma processor.

As illustrated in the figure, at a beam current of 15 ma (say at 200 kV, this is only 3 kilowatts or 3000 $j.s^{-1}$ in the electron beam), at a stream velocity of 500 fpm (150 mpm) we deliver 4.5 kGy to the stream, or at 1000 fpm (300 mpm) a dose of 2.25 kGy. These are quite practical treatment levels for many industrial applications including: disinfestation of agroproducts, elimination of pathogens such as *salmonella typhimurium* and *Escherischia coli* in animal and human foodstuffs, elimination of fungal contaminants in stored products, as well as reduction/elimination of most common aerobic bacteria from processed food products. Higher treatment levels are available from higher power machines, but the above cases illustrate the high productivity available with the art taught here using processors of modest power level.

For example, using the facility shown schematically in FIG. 4, the product can be moved along the length of the electron beam, rather than across its narrow dimension. For the system described, this would provide the same dose delivery capability at 2.5 times the speed or 2.5×4.5 kGy=11 kGy at the 500 fpm example cited above.

It should be noted that low fluid bed velocities cannot be used effectively to provide increased treatment levels. This arises from the effect of powder settling or stalling (a process referred to as "saltation") in the air stream as velocity is reduced. For the particle sizes studied here (~150 μm) this begins to occur at around 300 fpm (100 mpm) or at much higher velocities where surface treatment of heavier particles (e.g. φ~1000 μm) may be of interest.

Process Diagnostics

The precise control of the process depends upon setting the appropriate dose rate dD/dt (in kGy/s) delivered by the electron beam to that required by the fluidized bed conditions. These conditions are stream velocity v and bed thickness .t (expressed in gsm or grams per square meter) and, of course, the required delivered dose required to accomplish the desired effect in the product.

In the process taught here, the electron processor parameter dD/dt is determined by electron beam current which is (a) metered directly in the processor control system and (b) is determined independently by the real time radiation monitoring techniques as described in "Real Time Monitoring of Electron Processors", Nablo, S. V., Kneeland, D. R. and McLaughlin, W. L. Radiation. Phys Chem. 46,#4–6, pp. 1377–1383, 1995.

The stream velocity can be determined by Pitot tube techniques. These techniques are not accurate at velocities under 200 m/minute, so that dosimetric techniques have been used to ascertain v experimentally. This can be accomplished by measurement of the dose delivered to the fluidized bed or air stream at a machine current I (ma), since the machine constant k for the geometry used can be determined using conventional dosimetry, one can deduce v of the stream from the relation:

$$\frac{D(kGy) = k(kGy\ mpm/ma)\cdot I(ma)}{v(mpm)}$$

For this work, D has been determined both with the use of 50 gsm thick films of Far West Technology radiochromic dosimeters carried by the fluidized bed, as described for example in "Radiochromic Dosimetry for Validation and Commissioning of Industrial Radiation Processes", McLaughlin, W. L., Humphreys, J. C., Hocker, D., and Chappas, W. J., Radiat. Phys. Chem. 31, 505 (1988), or with the use of alanine powder dosimetry, such as that described by McLaughlin, W. L., Desrosiers, M. F. and Saylor, M. C., in "ESR-Based Analysis in Radiation Processing", pp 213–239, *Sterilization of Medical Products*; ed. R. F. Morrissey, Polysciences Publications Inc., Morin Heights, Quebec.

Both of these techniques have provided good velocity determinations for the studies conducted here, and provide a reliable basis for dose data required for these applications. The advantage of alanine is its availability as a fine powder so that it can be readily transported in the fluidized bed, even at low velocities or low stream loading by the product.

The third parameter, bed thickness T, may not be required if the mass flow rates ($gs^{-1}$) are sufficiently low and the stream velocity (or bed flow rate dB/dt) is sufficiently high that the stream thickness T<<the effective electron range. For example, for our work the stream beds were 5 to 50 gsm, but at the 200 kV voltages used we have an electron range of over 100 gsm, so the bed thickness was always 50% or less of the electron stream penetration capability.

To summarize, for a mass flow rate dm/dt ($g.s^{-1}$) in the fluidized bed, and a bed flow rate of dB/dt ($cc.\ s^{-1}$), for a duct of thickness d (cm) we can calculate the bed thickness t in g $cm^{-2}$ from:

$$t(g.cm^{-2}) = [dm/dt\ (g.s^{-1})/dB/dt\ (cc.s^{-1})]d(cm)$$

Figure 10:
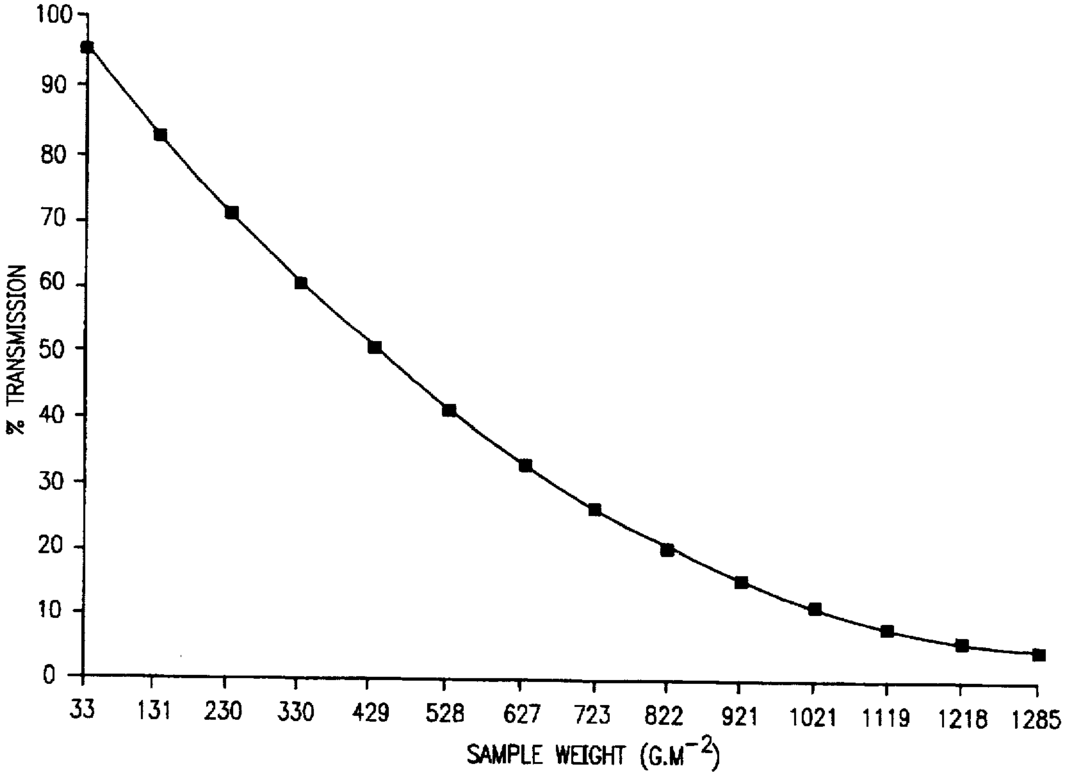
FIG. 10 shows a presentation of the absorption curve for a 85 Kr gauge.

For the process taught here, bed thickness can be easily monitored with the use of beta emitting radioisotope thickness gauges of the type manufactured, for example, by Collaborative Research Inc., Frederick, Md. (Model AT-100). Using long lived beta emitters such as 85 Kr, precise control of stream bed thickness is possible for the range of 10–300 gsm of interest here. A presentation of the absorption curve for a 85 Kr gauge taken from CRI literature is shown in FIG. 10. Such a monitor can be used, either to control the bed thickness over a narrow range so that the processor voltage setting (electron energy) is used most efficiently, or it can be used to set the processor voltage over its available operating range to most effectively utilize the electron beam for the bed thickness monitored.

Experimental Results

The ability of the pneumatic transfer or fluidized bed technique for the effective presentation of product to an energetic electron beam can be demonstrated in a number of ways. Any of these must document the ability of the electrons to uniformly treat the product while passing through the beam while supported in the air stream. Three techniques have been used here: (1) powder dosimetry (2) film dosimetry (3) micro-organism lethality. Each of these will be described in turn.

(1) Alanine or Powder Dosimetry

Mixtures of 10% by weight Alanine powder (ϕ<50 μm) and corn starch (ϕ<150 μm) were prepared and irradiated at the NIST $^{60}Co$ facility to provide a reference of the ESR signal expected from the alanine over the dose range 1–10 kGy. Samples run on the experimental apparatus taught here were electron irradiated at nominal levels of 1 and 3 kGy and sent to NIST for assay.

| Run # | Voltage | Current | Speed | Est. Dose | Alanine Dose |
|---|---|---|---|---|---|
| 40 | 200 kV | 10 ma | 1810 fpm | 1.03 kGy | 0.78 ± 0.08 kGy |
| 41 | 200 kV | 10 ma | 1810 fpm | 1.03 ± 0.10 | 0.78 ± 0.08 kGy |
| 42 | 200 kV | 30 ma | 1810 fpm | 3.09 kGy | 2.13 ± 0.21 kGy |
| 43 | 200 kV | 30 ma | 1810 fpm | 3.09 ± 0.31 | 2.78 ± 0.28 kGy |

For the data recorded, one can conclude that the agreement is good and that the product is being treated quite uniformly by the electron beam. In fact, the speed of 1810 fpm is that inferred from the thin film measurements and reflects the reduced speed of the film with respect to the product. Using the more accurate figure of 0.78 kGy, the inferred velocity is 2410 fpm.

(2) Radiochromic Film Dosimetry

The data recorded here were run at varying feed rates under different (throttled) flow conditions, so that the consistency of the data may be taken as an indication of the reproducibility of the fluidized bed technique.

| Run # | Flow Cond$^N$ | Product | # Dos | # Passes | Current (ma) | Dose/Pass (kGy) | Vel (fpm) |
|---|---|---|---|---|---|---|---|
| 34 | Full | Fine Mash A | 4 | 3 | 10 | 1.12 | 1393 |
| 35 | Full | Fine Mash A | 4 | 3 | 10 | 1.34 | 1403 |
| 42 | Full | Corn Starch B | 3 | 3 | 10 | 1.07 | 1757 |
| 43 | Full | Corn Starch B | 3 | 3 | 10 | 1.00 | 1880 |
| 48 | Full | Fine Seed C | 3 | 1 | 10 | 1.00 | 1446 |
| 51 | ¾ | Sunflower Seed D | 4 | 2 | 10 | 3.05 | 616 |
| 52 | ¾ | Sunflower Seed D | 4 | 1 | 10 | 2.70 | 696 |
| 53 | ¾ | Sunflower Seed D | 4 | 1 | 5 | 1.35 | 696 |
| 61 | ¾ | Fine Mash E | 4 | 4 | 10 | 2.80 | 671 |

With the large number of dosimeters used in these measurements, whose location in the fluidized be was completely random, we see a good internal consistency in these data for each of the five different products used in these trials.

An indication of the excellent agreement which can be achieved using the "powder" and film dosimetric techniques is illustrated by the following:

(a) Using fine (100 μm) corn starch, and a measured machine yield k of 188 kGy fpm/ma, one can calculate the average powder velocity from the relation v=kI/D. For the alanine calibration case, with an unchoked transport system, we calculate the stream velocity to be:

$$v=188\times10/.78=2410 \text{ fpm}$$

(b) With a throttled transport system, and using film dosimetry, we measured 5.2 kGy per pass at 10 ma. This implies a velocity of:

$$v=188\times10/5.2=362 \text{ fpm}$$

(c) If we used the dose ratios alone for the throttled:unthrottled conditions, we have 5.2 kGy for the former and .78 for the latter under the same electron processor conditions, hence the inferred "throttled" velocity is:

$$v=\frac{.78}{(.78/5.2)\times 2410}=362$$

In excellent agreement with that calculated above from the less accurate thin film dosimetrically determined data.

(3) Microorganism Lethality

Because of the limited penetration depths in matter of the 200 kV electrons (actual fluidized bed energy of 160 keV) used in this work, one would expect a truly exponential behavior of the surviving fraction of the bioburden with dose for very fine powders. Of course, any abnormal distribution of the radiation resistance in the population could alter this behavior, but, in general, it is possible to infer irradiation efficacy with the fluidized bed technique by an examination of the D values encountered for the bioburdens. One would also expect that the surface concentration of microorganisms far exceeds that in the bulk carried by the natural (agro) products studied here. Bioassays of the control samples and of the irradiated samples were conducted by MicroTest Laboratories of Agawam, Mass. according to standard FDA/USDA/BAM (Biological Analytical Methods) protocol.

A summary of D values, or those doses required to reduce the fungal microbial population by a decade, are shown in table 1. Six different "agricultural" products are shown here with relatively low fungal bioburdens but in some cases, very high aerobic bioburdens (D values for which were also measured but not shown here).

TABLE 1

Summary of Yeast and Mold D Value Determinators

| Sample # | Material | Feed Rate ($g \cdot s^{-1}$) | Speed (fpm) | D (kGy) | Bioburden* (cfu/g) |
|---|---|---|---|---|---|
| M1–M5 | Cracked Corn | 10.6 | 2265 | 0.86 | 81 (35) |
| M14–M17 | Oats | 7.5 | 2380 | 0.21 | 590 (51,000) |
| M19–M22 | Sunflower Seed | 8.3 | 2380 | 0.50 | 370 (2100) |
| M25–M28 | THC Mash | 4.6 | 2890 | 1.35 | 710 (5000) |
| M35–M39 | Wagner's Seed | 7.5 | 783 | 4.2 | 4700 (1,200,000) |
| M60–M62 | Agway RMH | 6.4 | 672 | 4.2 | 3300 (1,200,000) |

*The untreated fungal population is given, with the aerobic bioburden in parenthesis

TABLE 2

Summary of Feed Rate Dependence at Fixed Dose (for Yeasts and Molds)

| Sample # | Material | Feed Rate | Fungal Population Ratio:Control |
|---|---|---|---|
| M3 | Corn | $11.5\ g \cdot s^{-1}$ | 0.54 |
| M30 | Corn | $88.5\ g \cdot s^{-1}$ | 0.52 |
| M38 | Wagner's Seed | $7.5\ g \cdot s^{-1}$ | 0.17 |
| M39 | Wagner's Seed | $23.4\ g \cdot s^{-1}$ | 0.38 |

Table 2 summarizes the fungal lethality efficacy of the electron beam fluidized bed technology taught here, for two different agroproducts—namely corn and mixed seed (sunflower, corn and mullet). In the former case, a low dose treatment at fixed speed (0.42 kGy at 2265 fpm) was studied at widely varying feed rates (×7.7) or stream loading factors. One sees from the bioassay results that no "rate effect" is discernible. The second set of data were recorded at much higher doses (2.7 kGy at 783 fpm). The results do suggest a modest "rate effect" in this case with a feed rate ratio of 3.1 for these data. One would expect any rate effect to be more evident with the coarser products (due to "shielding" effects); in table 2 the Wagner's Seed mixture was a much coarser texture than the cracked corn. In any industrial process, such an "effective" increase in D value with texture could be easily compensated for to ensure the requisite quality of the processed product.

Figure 11:
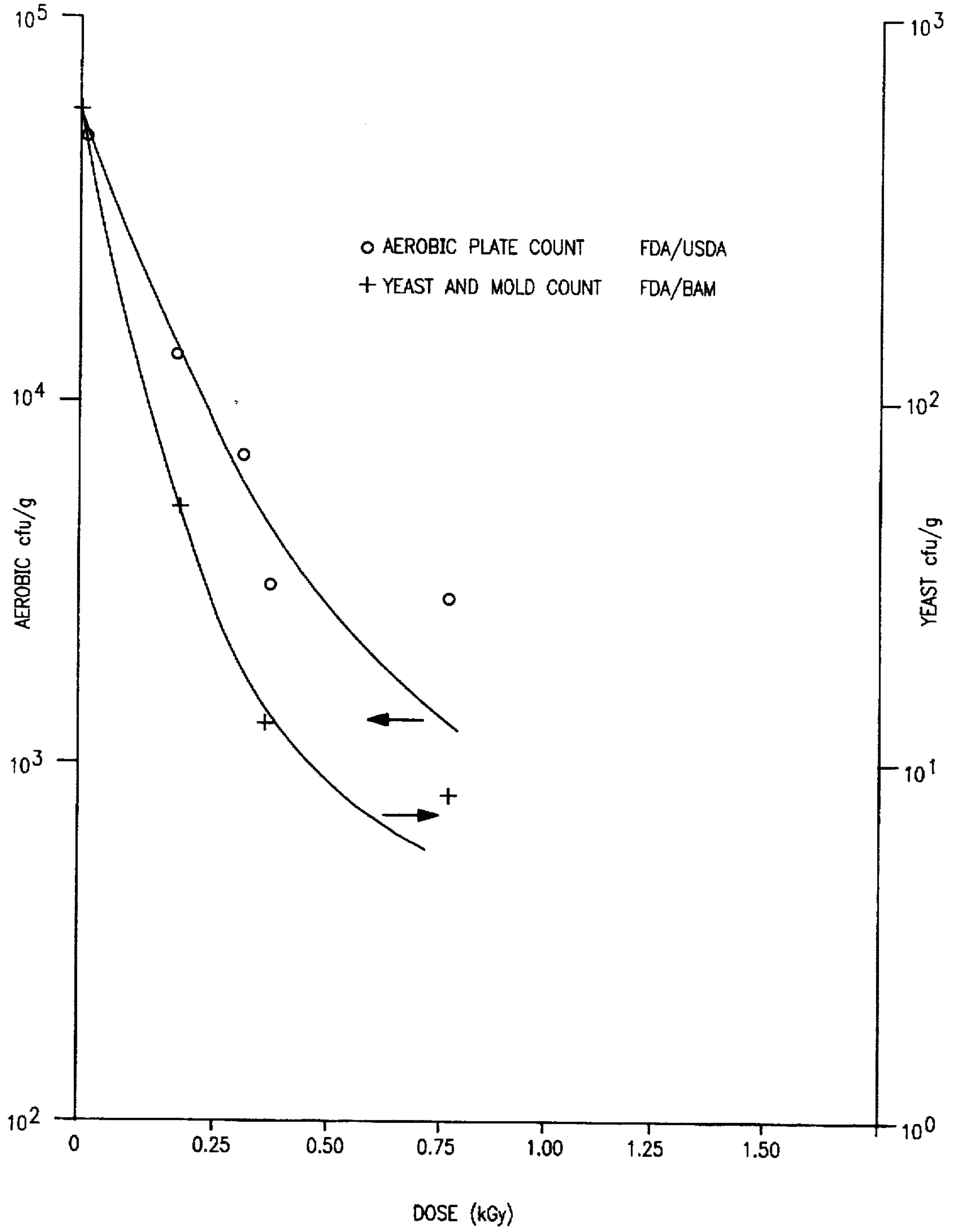
FIG. 11 presents a typical low energy electron beam lethality profile.

FIG. 11 presents a typical low energy electron beam lethality profile for the natural aerobic and fungal bioburdens in oats at a feed rate of 10.5 g/sec. In this case the aerobic population is about 100 times the fungal population with the D value of the latter about 0.5 that of the former, as would be normally expected.

These values are in good agreement with the known radiation resistance of various microorganisms. For example, *Bacillus subtilis*, an aerobic spore former, has a D value of 0.6 kGy, rather typical of these species. *Aspergillus niger*, a black yeast common to such foodstuffs, has a D value of 0.5 kGy. Because the species present in the bioburden of this product (fine mash) are not identified, the D values resulting from these experiments indicate the microorganism resistance expected from this type of agroproduct. Furthermore, the exponential behavior of the survival curves indicates uniform treatment of the product by the electron beam under the wide range of conditions experienced here ($dm/dt=6–90\ g.s^{-1}$; $v=670–2900$ fpm).

The invention comprehends the following features:

1. apparatus for the transport and presentation of fine powders and aggregates to a low energy electron processor ($E \leq 500$ keV)

2. method for treatment and its control, of fine powders and aggregates with an electron processor.

3. method of and apparatus for the disinfestation of fine powders, aggregates and pellets of organic materials for enhancement of their storage properties using low energy electrons.

4. method of and apparatus for the sterilization of fine powders and aggregates for use in pharmaceuticals, cosmetics and food preparation using low energy electrons.

5. method of and apparatus for the treatment of the surfaces of powders, aggregates and pellets using low energy electrons to effect surface modification via crosslinking or grafting of other materials which provide improved functional properties.

6. method of and apparatus for the (pasteurization) treatment of the surfaces of agroproducts such as cereal grains, fish meal and the like for the elimination of both spoilage microorganisms and pathogens for ensuring regulatory compliance of such raw materials.

7. the use of a secondary electron window to seal the duct and a rectangular irradiation section transitioned to a cylindrical duct of the same cross-sectional area to provide efficient shielding of the x-rays generated by the beam in the rectangular cross-section treatment section of the duct.

8. method of and apparatus for the electron beam sterilization of agroproducts such as peat used as carriers for nitrogen fixation bacteria in biological fertilizers.

9. method of and apparatus for the pre-irradiation of powders and aerosols subsequently reacted with other materials and surfaces for their graft modification so as to achieve improved functional properties (such as) wettability (surface tension), coefficient of friction, hydrophobic and hydrophilic behavior, inflammability, etc.)

Having thus described the principles of the invention, together with several illustrative embodiments thereof, it is to be understood that, although specific terms are employed, they are used in a generic and descriptive sense, and not for purposes of limitation, the scope of the invention being set forth in the following claims:

We claim:

1. Method of irradiating powders or aggregates with electrons, which method comprises the following steps: producing a beam of low-energy electrons, and pneumatically transferring said powders or aggregates through said beam at atmospheric pressure as a thin layer moving at high velocity.

2. Method according to claim 1 wherein said high velocity is of the order of $10^3$ feet per minute.

3. Method according to claim 1 wherein said thin layer has a stream thickness which is less than 500 $g/m^2$.

4. Apparatus for irradiating powders or aggregates with electrons, comprising in combination means for producing a beam of low-energy electrons, and means for pneumatically transferring said powders or aggregates through a treatment duct which delivers said powders or aggregates through said beam at atmospheric pressure as a thin layer moving at high velocity.

5. Apparatus according to claim 4 wherein said treatment duct has a thickness of the order of 5 cm.

* * * * *